United States Patent [19]

Yoshikawa et al.

[11] Patent Number: 4,520,280

[45] Date of Patent: May 28, 1985

[54] APPARATUS FOR DETECTING INPUT SIGNAL

[75] Inventors: Shozi Yoshikawa; Hiroshi Kodama; Ken Ohsima, all of Hachioji; Masaharu Sakamoto, Tokyo; Kiichi Kato, Hachioji; Kunio Yamamiya, Tokyo, all of Japan

[73] Assignee: Olympus Optical Company Limited, Japan

[21] Appl. No.: 406,487

[22] Filed: Aug. 9, 1982

[30] Foreign Application Priority Data

Aug. 13, 1981 [JP] Japan .................................. 56-126005

[51] Int. Cl.³ ............................................. H03K 5/153
[52] U.S. Cl. ..................................... 307/358; 307/356; 328/162; 382/50
[58] Field of Search ...................... 307/358, 360, 356; 328/162, 164; 382/50, 52, 53

[56] References Cited

U.S. PATENT DOCUMENTS

| 3,472,958 | 10/1969 | Estock ........................... 382/52 |
| 3,504,289 | 3/1970 | Pfeiffer et al. ..................... 328/164 |
| 4,132,977 | 1/1979 | Nagano ........................... 382/53 |

Primary Examiner—John Zazworsky
Attorney, Agent, or Firm—Parkhurst & Oliff

[57] ABSTRACT

An input signal containing a base line which fluctuates to a great extent is detected or restored by comparing the input signal with reference levels which are shifted in accordance with the fluctuation of base line. The input signal is sampled at a variable sampling rate and an average of sampled values for a predetermined period is derived to produce a profile signal which resembles accurately the fluctuation of the base line. The profile signal thus obtained is added to upper and lower threshold voltages to produce the reference levels which have been corrected in accordance with the fluctuation of the base line of input signal.

12 Claims, 13 Drawing Figures

FIG. 1
PRIOR ART
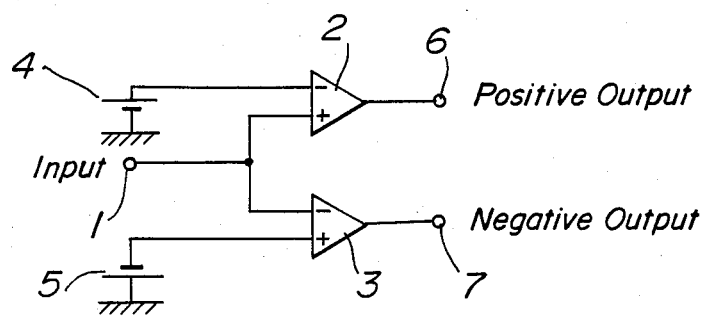
PRIOR ART
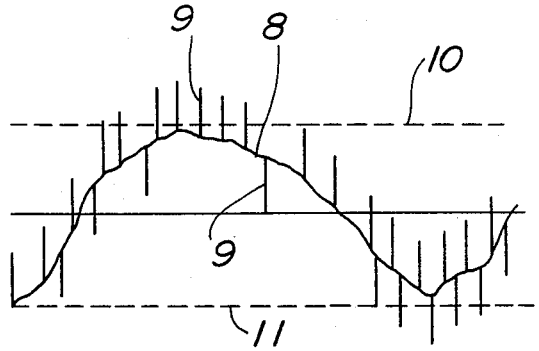
FIG. 2A
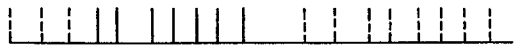
FIG. 2B
FIG. 2C

FIG. 4A
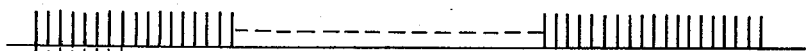
FIG. 4B
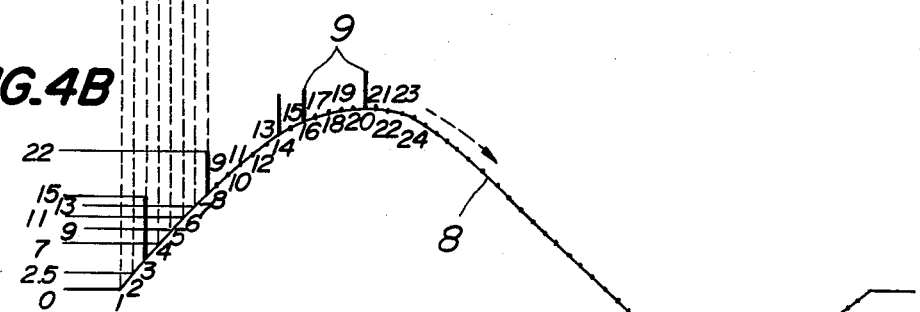
FIG. 4C
FIG. 5
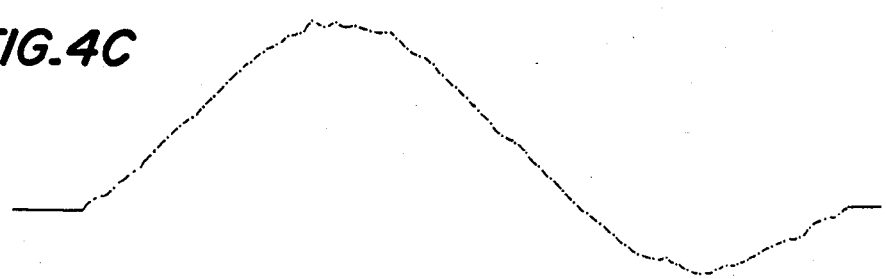

APPARATUS FOR DETECTING INPUT SIGNAL

BACKGROUND OF THE INVENTION

The present invention relates to an apparatus for detecting an input signal comprising means for comparing the input signal with threshold values.

FIG. 1 is a circuit diagram showing a known typical apparatus for detecting or restoring a bivalent signal. An input signal is supplied to an input terminal 1 and is supplied to positive and negative input terminals of comparators 2 and 3, respectively to the other inputs of which positive and negative threshold values are applied from fixed reference voltage sources 4 and 5, respectively. Then output signals representing positive and negative input signals are derived at output terminals 6 and 7, respectively.

In the known apparatus, when the input signal having a base line 8 which fluctuates greatly over peaks of a signal 9 as shown in FIG. 2A is supplied to the input terminal 1, the input signal could not be obtained correctly unless the positive and negative threshold values 10 and 11 are set beyond a fluctuation range of the base line 8. Then the signals which do not exceed the threshold values 10 and 11 are not detected as illustrated by dotted lines in FIGS. 2B and 2C. FIG. 2B shows detected signals greater than the base level 8 and FIG. 2C those smaller than the base level. In this manner, the known apparatus could not correctly detect the input signal.

In order to avoid such a drawback, it has been proposed to pass the input signal through a high pass filter before comparing it with the threshold levels. However, in such a case it is quite difficult to remove only the fluctuation of the base line, particuarly when the base line contains pulsatory noise.

SUMMARY OF THE INVENTION

The present invention has for its object to provide a novel and useful apparatus which can detect input signals in a correct and reliable manner even if a base line fluctuates to a great extent.

According to the invention, an apparatus for detecting an input signal comprises:

means for receiving the input signal and forming a profile signal which resembles a fluctuation of a base line of the input signal;

means for adding said profile signal to upper and lower threshold levels to form upper and lower reference levels; and means for comparing the input signal with said reference levels to derive output signals when said input signal exceeds the reference levels.

BRIEF DESCRIPTION OF THE DRAWINGS

FIG. 1 is a circuit diagram showing a known typical apparatus for detecting an input signal;

FIGS. 2A, 2B and 2C are waveforms for explaining an operation of the apparatus shown in FIG. 1;

FIGS. 4A, 4B and 4C are waveforms for explaining a relation between the input signal and a profile signal;

FIG. 5 is a diagram for explaining a process for calculating an average of shift.

DESCRIPTION OF THE PREFERRED EMBODIMENTS

Figure 3:
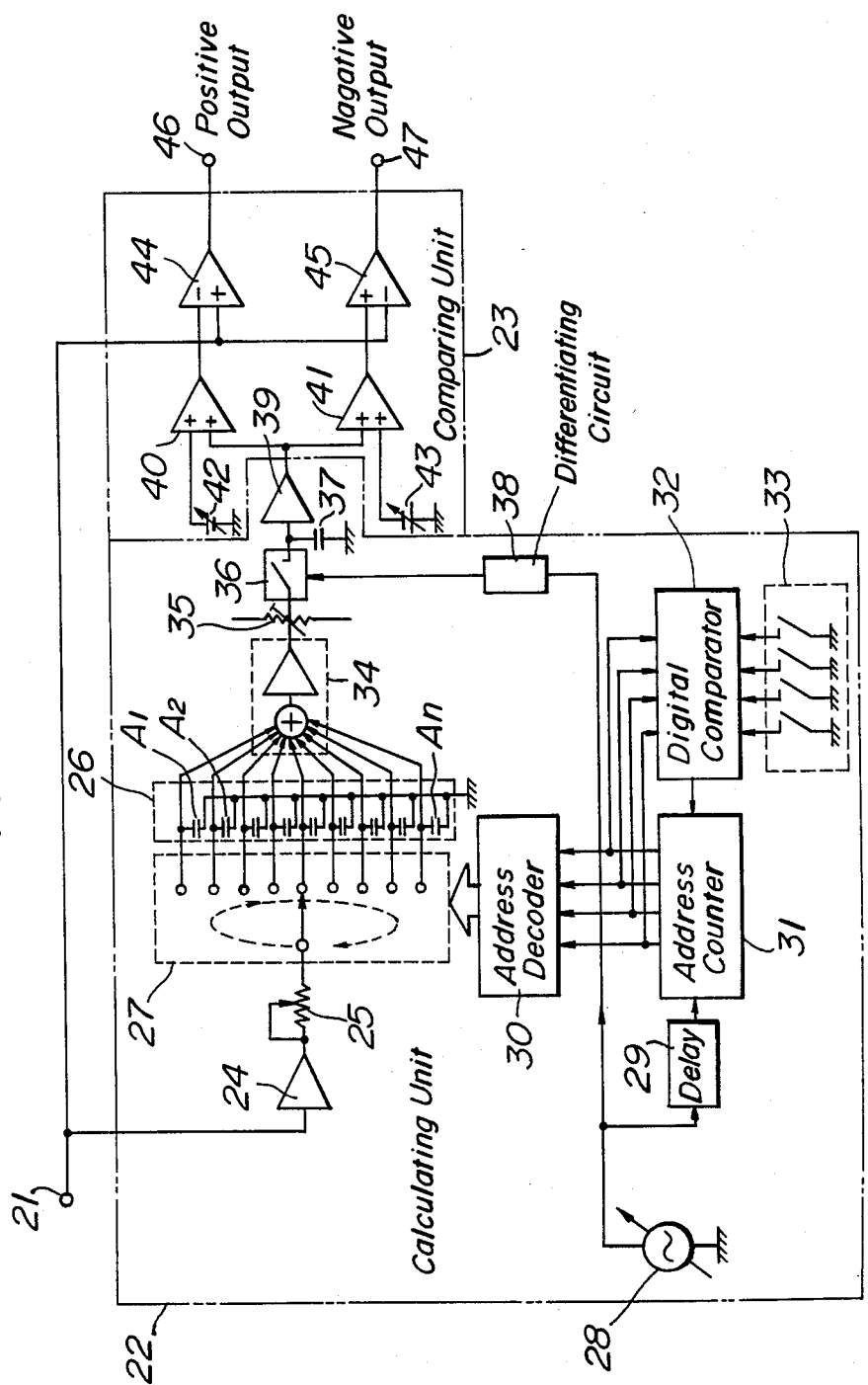
FIG. 3 is a block diagram illustrating an embodiment of the apparatus for detecting an input signal according to the invention.

FIG. 3 is a block diagram showing an embodiment of the apparatus for detecting an input signal according to the invention. The apparatus is mainly composed of a calculating unit 22 for calculating an average of shift to derive a profile signal of an input signal supplied at an input terminal 21, and a comparing unit 23 for comparing the input signal with reference values which have been obtained by superimposing the calculated result upon threshold levels.

The calculating unit 22 comprises a buffer amplifier 24 for amplifying the input voltage to decrease a load for a signal source. The unit 22 further comprises a variable resistor 25 which constitutes together with a hold capacitor device 26 a low pass filter. By adjusting the variable resistor 25, it is possible to change a cut-off frequency of the low pass filter. It should be noted that this function is not essential for calculating the average of shift. There is further provided a multiplexer 27 which connects successively hold capacitors $A_1, A_2 \ldots A_n$ having the same capacitance in the hold capacitor device 26 into a circuit in a given order determined by an address selection circuit. The address selection circuit comprises a variable frequency pulse generator 28, a delay circuit 29, an address decoder 30, an address counter 31, a digital comparator 32 and a preset switch 33. In this manner, the input signal supplied via the variable resistor 25 is sampled and held in the hold capacitors $A_1$ to $A_n$. A switching rate of the multiplexer 27, i.e. the sampling rate can be varied within a very wide range by changing the oscillating frequency of the pulse generator 28. The address counter 31 is so constructed that it is reset when the digital comparator 32 detects a coincidence between a digital value set by the preset switch 33 and a count value of the address counter 31 which counts clock pulses generated from the variable frequency pulse generator 28. Therefore, the multiplexer 27 can switch cyclically in the given order the predetermined number of the hold capacitors $A_1$ to $A_m$ of the hold capacitor device 26, said number being previously selected by the preset switch 33. That is to say, the sampling rate can be adjusted by changing the oscillating frequency of the pulse generator 28 and the number of sampled values which are used to provide weights for reference voltages can be adjusted by means of the preset switch 33.

The calculating unit 22 further comprises an adder 34 for adding all the voltages stored in the hold capacitors $A_1$ to $A_m$, and a variable attenuator 35 for effecting a level adjustment in case of changing the weights. The adder 34 and variable attenuator 35 constitute a circuit for calculating an average value of shift of a base line of the input signal. There is further provided an analog switch 36 which transmits the output of the variable attenuator 35 to a hold capacitor 37, said output being produced immediately before the switching of the multiplexer 27. To this end, the analog switch 36 is driven by differential pulses from a differentiating circuit 38 which produces the pulses at leading edges of the clock pulses supplied from the pulse generator 28.

The delay circuit 29 is inserted between the pulse generator 28 and the address counter 31 and ensures that the address for the multiplexer 27 is changed after the output of the attenuator 35 has been transmitted to the hold capacitor 37. The voltage stored in the hold capacitor 37 is amplified by a second buffer amplifier 39 having a high input resistance.

The output voltage from the buffer amplifier 39 is applied to first and second adders 40 and 41 provided in the comparing unit 23 and is added to positive and negative threshold voltages +VTH and −VTH applied from positive and negative threshold voltage sources 42 and 43, respectively. The added voltages constitute positive and negative reference voltages for first and second comparators 44 and 45, respectively. That is to say, the output voltages of the first and second adders 40 and 41 are applied to negative and positive input terminals of the first and second comparators 44 and 45, respectively and the input voltage is applied to positive and negative input terminals of the comparators 44 and 45. Therefore, positive and negative output signals are applied at output terminals 46 and 47, respectively.

Now the operation of the detecting apparatus shown in FIG. 3 will be explained in detail. The input signal supplied to the calculating unit 22 is passed through the first buffer amplifier 24, the variable resistor 25 and the multiplexer 27 and is sampled at the predetermined sampling rate and held in hold capacitors $A_1$, $A_2$, $A_3$, . . . successively up to the number predetermined by the preset switch 33. When the count value of the address counter 30 becomes identical with the preset count, the address counter 30 is reset. Then, the multiplexer 27 is driven into the initial condition and stores the sampled value in the first capacitor $A_1$. In this manner, the predetermined number of capacitors $A_1$, $A_2$, . . . $A_m$ are cyclically connected into a circuit.

It is now assumed that the switching period of the multiplexer 27 is t, and the number of the selected hold capacitors is m=8. Then, the voltage held in the first capacitor $A_1$ is renewed after a period of 8t has passed. The second capacitor holds the sampled voltage of also for the period 8t. In this manner, the voltages held in the eight capacitors $A_1$, $A_2$, . . . $A_8$ are successively renewed at 8t period. Therefore, when a total sum of the voltages stored in the capacitors $A_1$, $A_2$, . . . $A_8$ is divided by eight, it is possible to derive an average of shift at successive time instances. This average of shift is obtained by dividing a sum from the adder 34 by a factor of eight in the attenuator 35.

The result of this calculation is transmitted to the hold capacitor 37 and is held therein via the analog switch 36 which is made conductive by the differential pulses supplied from the differentiating circuit 38.

FIG. 4A illustrates the clock pulses produced by the variable frequency pulse generator 28, and FIG. 4B shows the input signal supplied from the input terminal 21. For the sake of explanation, the signals 9 are denoted as being synchronized with the clock pulses. The input signal contains the base line 8 which fluctuates within a very wide range, particularly beyond the peaks of the signals 9. Numerals 1, 2, ... denoted beside the base line 8 represent the sampling timings and numerals 0, 2.5, 7, 9, ... express sampled values at these sampling timings.

FIG. 5 is a diagram showing a process for calculating the average of shift. In the first row, there are shown the sampling timings, in second to ninth rows there are illustrated sampled values stored in the respective hold capacitors $A_1$ to $A_8$, and in the last row there is depicted the average value of the voltages stored in the hold capacitors $A_1$ to $A_8$, i.e.

$$\sum_{m=1}^{8} A_m/8.$$

FIG. 4C illustrates the average of shift calculated by the calculating unit 22. This average of shift resembles accurately the base line 8 of the input signal even if the peak values are sampled at t=3, 8, 14, . . . . It can be further shown in FIG. 4C that a delay of the average of shift with respect to the input signal is very small and negligible. Here, the average of shift is also called a profile signal of base line.

Figure 6A:
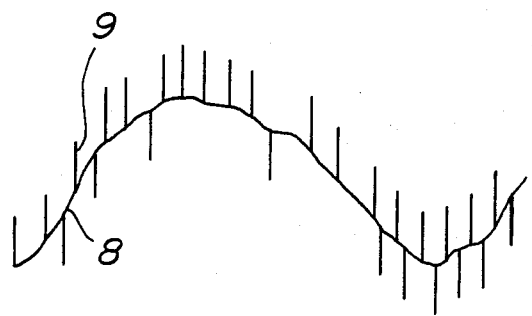
FIGS. 6A to 6D are waveforms for explaining an operation of a comparing unit of the apparatus shown in FIG. 3.
Figure 6B:
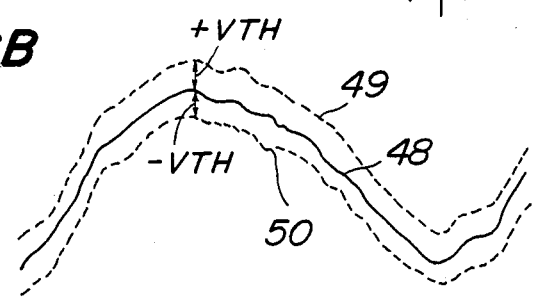
Figure 6C:
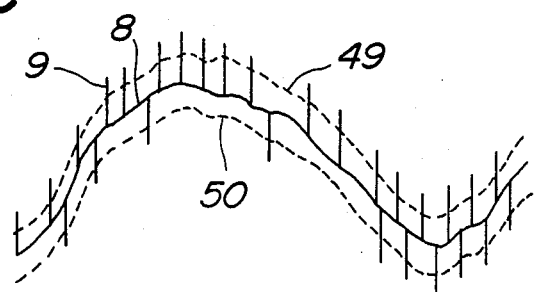
Figure 6D:
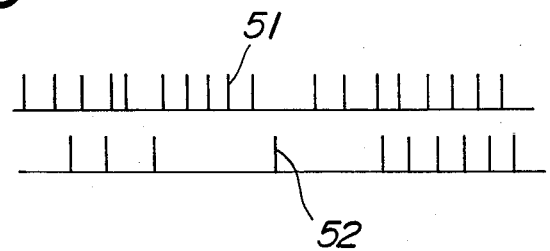

The profile signal of base line thus obtained is applied via the buffer amplifier 39 to the adders 40 and 41. FIG. 6A shows the input signal comprising the signals 9 which are superimposed upon the base line 8 which fluctuates greatly. In FIG. 6B, the profile signal is shown by a solid curve 48 which resembles the base line 8. The profile signal is added to the positive and negative threshold voltages +VTH and −VTH in the adders 40 and 41, respectively to obtain positive and negative reference voltages 49 and 50. These reference voltages are applied to the comparators 44 and 45, respectively to which the input signal is also applied. Then the input signal is compared with the reference levels 49 and 50 as illustrated in FIG. 6C. Then positive and negative output signals 51 and 52 are derived at the output terminals 46 and 47, respectively as shown in FIG. 6D. It is apparent that these output signals 51 and 52 represent the signals 9 in the input signal accurately.

The present invention is not limited to the embodiment explained above, but many modifications can be conceived by those skilled in the art within the scope of the invention. For instance, the calculating circuit may be formed by a digital circuit comprising an analog to digital converter, CPU and hard logic. The number of the samplings is not limited to eight, but may be set to any other number in accordance with the accuracy of detection. Moreover, in order to compensate a possible delay introduced by the calculating unit, it is possible to insert a delay circuit between the input terminal 21 and the comparators 44 and 45.

As described above in detail, according to the invention the input signal can be detected accurately even if the base line of the input signal fluctuates greatly. Further, although the base line contains noise having a short fixed period, it is possible to remove the influence of the noise upon the profile signal by suitably selecting the sampling rate and thus, the detection accuracy can be increased much more as compared with that in which the input signal is merely passed through a high pass filter. Moreover, since the sampling rate and the threshold levels can be adjusted in the above embodiment, the profile signal which follows precisely the base line fluctuation can be always obtained and therefore, the very stable and accurate detection can be effected.

What is claimed is:

1. An apparatus for detecting an input signal comprising:
   means for receiving the input signal and forming a profile signal which resembles a fluctuation of a base line of the input signal;
   means for adding said profile signal to upper and lower threshold levels to form upper and lower reference levels; and means for comparing the input signal with said reference levels to derive output signals when said input signal exceeds the reference levels.

2. An apparatus for detecting an input signal comprising:
   means for receiving an input signal and forming a profile signal which resembles a fluctuation of a base line of the input signal, said means for forming said profile signal comprising means for sampling the input signal at a predetermined sampling rate and means for deriving an average of sampled values for a predetermined period;
   means for adding said profile signal to upper and lower threshhold levels to form upper and lower reference levels; and
   means for comparing said input signal with said reference levels to derive output signals when said input signal exceed said reference levels.

3. An apparatus according to claim 2, wherein said sampling means comprises a multiplexer which is driven cyclically by an address selection circuit, and said average deriving means comprises a plurality of hold capacitors which are selectively connected into circuit, an adder for producing a sum of all the sampled values stored in the hold capacitors and an attenuator for dividing said sum by a factor related to said predetermined period.

4. An apparatus according to claim 3, wherein said address selection circuit comprises a variable frequency pulse generator for generating clock pulses of a desired frequency, a counter for counting the clock pulses, a preset switch for presetting a value correponding to said predetermined period, and a digital comparator for comparing a count value of the counter with the preset value, whereby when said digital comparator detects a coincidence, said counter is reset.

5. An apparatus according to claim 4, wherein said address selection circuit further comprises a delay circuit inserted between the pulse generator and the counter.

6. An apparatus according to claim 4, wherein said profile signal forming means further comprises an analog switch which is made conductive by signals produced at the leading edges of clock pulses to conduct the profile signal.

7. An apparatus according to claim 4, wherein said attenuator is composed of a variable attenuator.

8. An apparatus for detecting an input signal comprising:
   means for receiving an input signal and forming a profile signal which resembles a fluctuation of a base line of the input signal;
   means for adding said profile signal to upper and lower threshhold levels to form upper and lower reference levels, said upper and lower threshhold levels being produced by variable voltage sources; and
   means for comparing said input signal with said reference levels to derive output signals when said input signal exceeds said reference levels.

9. An apparatus for detecting an input signal comprising:
   means for receiving an input signal;
   means responsive to said input signal for providing an averaged signal;
   means for providing upper and lower threshhold signals;
   means for adding said averaged signal to said upper and lower threshhold signals to produce upper and lower reference signals, respectively; and
   means for comparing said input signal with each of said reference signals to derive output signals when said input signal exceeds a reference level.

10. An apparatus for detecting an input signal comprising:
    means for receiving an input signal;
    means responsive to said input signal for deriving a signal which represents a base line fluctuation of said input signal;
    means for providing first and second threshhold signals;
    means for adding said derived signal to said first threshhold signal to provide a first reference level;
    means for adding said derived signal to said second threshhold signal to form a second reference signal;
    first means for comparing said input signal with said first reference signal to derive a first output signal; and
    second means for comparing said input signal with said second reference signal to derive a second output signal.

11. The apparatus of claim 10 wherein said first means for comparing is a comparator having a positive terminal coupled to receive said input signal and a negative terminal coupled to receive said first reference signal and said second means for comparing is a comparator having a negative terminal coupled to receive said input signal and a positive terminal coupled to receive said second reference signal.

12. An apparatus for detecting an input signal comprising:
    means for receiving an input signal;
    means responsive to said input signal for deriving an averaged signal;
    means for providing at least one threshhold signal;
    means for adding said averaged signal to said at least one threshhold signal to produce a reference signal; and
    means for comparing said input signal with said reference signal to derive an output signal when said input signal exceeds said reference signal.

* * * * *